(12) United States Patent
Fan

(10) Patent No.: US 10,134,962 B2
(45) Date of Patent: Nov. 20, 2018

(54) QUANTUM DOT LED PACKAGE STRUCTURE

(71) Applicant: Shenzhen China Star Optoelectronics Technology Co., Ltd., Shenzhen (CN)

(72) Inventor: Yong Fan, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 64 days.

(21) Appl. No.: 15/529,507

(22) PCT Filed: Apr. 19, 2017

(86) PCT No.: PCT/CN2017/081034
§ 371 (c)(1),
(2) Date: May 25, 2017

(87) PCT Pub. No.: WO2018/176525
PCT Pub. Date: Oct. 4, 2018

(65) Prior Publication Data
US 2018/0309032 A1    Oct. 25, 2018

(30) Foreign Application Priority Data
Mar. 30, 2017   (CN) .......................... 2017 1 0202967

(51) Int. Cl.
*H01L 51/56* (2006.01)
*H01L 33/56* (2010.01)
(Continued)

(52) U.S. Cl.
CPC .............. *H01L 33/56* (2013.01); *H01L 33/06* (2013.01); *H01L 33/641* (2013.01)

(58) Field of Classification Search
None
See application file for complete search history.

(56) References Cited

U.S. PATENT DOCUMENTS

| 2011/0068322 A1* | 3/2011 | Pickett | C09K 11/02 257/13 |
| 2014/0264196 A1* | 9/2014 | Werner | C23C 16/30 252/519.34 |

(Continued)

FOREIGN PATENT DOCUMENTS

| CN | 103681990 A | 3/2014 |
| CN | 203850332 U | 9/2014 |

(Continued)

*Primary Examiner* — Michael Lebentritt
(74) *Attorney, Agent, or Firm* — Leong C. Lei

(57) ABSTRACT

Provided is a quantum dot LED package structure comprising a bottom bracket, an external bracket, a quantum dot layer light emitting chip, an inorganic barrier layer and a top silica gel layer, wherein the inorganic barrier layer covers the external bracket and the quantum dot layer light emitting chip on the bottom bracket to package the external bracket and the quantum dot layer light emitting chip; the external bracket and the quantum dot layer light emitting chip are packaged by using the inorganic barrier layer, and a top silica gel layer is provided on the inorganic barrier layer, and the water and oxygen barrier condition that the existing package structure simply using the silica gel layer cannot meet can be satisfied and good heat dissipation can be provided. Thus, the issues of mass production difficulty, high cost, low luminous efficiency, difficulty to achieve narrow border application can be solved.

18 Claims, 2 Drawing Sheets

(51) Int. Cl.
*H01L 33/06* (2010.01)
*H01L 33/64* (2010.01)

(56) References Cited

U.S. PATENT DOCUMENTS

| | | | |
|---|---|---|---|
| 2015/0214445 A1* | 7/2015 | Qiu | H01L 27/15 |
| | | | 257/88 |
| 2015/0228869 A1* | 8/2015 | Yoo | H01L 33/54 |
| | | | 362/97.3 |
| 2017/0059129 A1* | 3/2017 | Li | G02F 1/1336 |
| 2017/0068132 A1* | 3/2017 | Li | G02F 1/133603 |
| 2017/0222096 A1* | 8/2017 | Fan | H01L 33/486 |

FOREIGN PATENT DOCUMENTS

| | | |
|---|---|---|
| CN | 104821364 A | 8/2015 |
| CN | 205452347 U | 8/2016 |

* cited by examiner

QUANTUM DOT LED PACKAGE STRUCTURE

FIELD OF THE INVENTION

The present invention relates to a display technology field, and more particularly to a quantum dot LED package structure.

BACKGROUND OF THE INVENTION

In recent years, the Thin Film Transistor-LCD (TFT-LCD) has been rapidly developed and applied widely. Most of the liquid crystal displays on the present market are back light type liquid crystal display devices, which comprise a liquid crystal display panel and a back light module. Generally, the liquid crystal display panel comprises a Color Filter (CF) substrate, a Thin Film Transistor (TFT) substrate, Liquid Crystal (LC) sandwiched between the CF substrate and TFT substrate and sealant. The working principle is that the light of backlight module is reflected to generate images by applying driving voltages to the two glass substrate for controlling the rotations of the liquid crystal molecules.

In the liquid crystal display devices of prior art, the white light emitting diodes (Light Emitting Diode, LED) are generally used as a backlight. The most common white LED is a LED with the blue light emitting chip (B chip) plus yellow phosphor (Y phosphor). As the LEDs using the yellow phosphor is employed to be a backlight within a liquid crystal display panel, the display's color saturation is generally relatively lower (the NTSC color gamut value is generally 72%), the color is not bright enough. In order to improve the color saturation and to achieve more vivid color performance, the yellow phosphor is mainly changed to red green (RG) phosphor at present, for having the white LED with blue light emitting chip plus red green phosphor. However, compared to the yellow phosphor, such arrangement can only increase about 25% of the color gamut (the NTSC color gamut value is generally 90%), which still cannot meet the new BT.2020 color gamut standard (equivalent to the NTSC color gamut value of 134%). At present, the technology using the quantum dots (Quantum Dot, QD) material with a narrow emission spectrum is the technology, which is the easiest to implement and the most energy efficient technology within the technologies able to achieve 80% BT.2020 color gamut standard now.

The quantum dots, also known as nanocrystals are nanoparticles, of which the particle sizes are generally between 1-10 nm, and due to the quantum confinement of the electrons and the holes, the continuous band structure becomes a discrete level structure having a molecular characteristic, and can be excited to emit fluorescence. The emission spectrum of the quantum dots can be controlled by changing the size of the quantum dots. By changing the size of the quantum dots and the chemical composition thereof, the emission spectrum can cover the entire visible region, and includes a wide excitation spectrum and a narrow emission spectrum, and thus the spectral coverage rate is higher. Moreover, compared with the fluorescence lifetime of the organic phosphor, the fluorescence lifetime of quantum dots is 3-5 times to have a good light stability. In short, the quantum dots are an ideal fluorescent material.

The quantum dot mixed material packaged in the LED bracket as a fluorescent luminescent material and silica gel is named as a quantum dot light emitting diode (QLED). However, the quantum dots are sensitive to water and oxygen, and the fluorescence efficiency will be irreversibly decreased as being exposed in the environment of water and oxygen. Therefore, the package of quantum dots needs to have a good water and oxygen insulation ability. In addition, as the temperature rise, the luminous efficiency of the quantum dot material will gradually decline, and the emission wavelength will be red shifted, so the quantum dot package needs to be able to insulate the high temperature or to have a better heat dissipation environment. At present, in the quantum dot LED backlight applications, the main package for the quantum dots is to package the quantum dots in the glass tube or in the water/oxygen-insulated polyethylene terephthalate (PET) film. However, the former uses the glass, and there are drawbacks of fragile, low light utilization, difficulty to achieve narrow border, while there are drawbacks of easily producing the blue light color shift of the backlight edge and high cost in the latter.

SUMMARY OF THE INVENTION

An objective of the present invention is to provide a quantum dot LED package structure, possessing good heat dissipation effect and water oxygen barrier effect to solve the issues of mass production difficulty, high cost, low luminous efficiency, difficulty to achieve narrow border application of the current quantum dot LED.

For realizing the aforesaid objective, the present invention provides a quantum dot LED package structure, comprising a bottom bracket, an external bracket, a quantum dot layer light emitting chip, an inorganic barrier layer and a top silica gel layer;

the quantum dot layer light emitting chip being provided on the bottom bracket;

the external bracket being provided on the bottom bracket and surrounding the quantum dot layer light emitting chip;

the inorganic barrier layer covering the external bracket and the quantum dot layer light emitting chip on the bottom bracket to package the external bracket and the quantum dot layer light emitting chip;

the top silica gel layer being provided on the inorganic barrier layer.

A material of the inorganic barrier layer is $SiO_2$, AlN, SiAlN or $Al_2O_3$.

The inorganic barrier layer is formed by a low temperature sputtering method, a plasma enhanced chemical vapor deposition method or a thermal evaporation method.

The quantum dot layer light emitting chip comprises a blue light emitting chip, a first insulation layer, a quantum dot layer, and a second insulation layer, which are provided on the bottom bracket from bottom to top in order.

The quantum dot layer comprises two quantum dot materials, which respectively are a red quantum dot material and a green quantum dot material.

The quantum dot layer comprises a quantum dot material, which is a green quantum dot material;

the top silica gel layer is a silica gel layer comprising a KSF phosphorescent material.

A material of the first insulation layer and the second insulation layer is silica gel or glass.

The bottom bracket comprises a first metal bracket and a second metal bracket spaced apart from each other, and an insulation bracket positioned between the first metal bracket and the second metal bracket;

the first metal bracket and the second metal bracket are respectively connected with an electrode positive and a negative electrode of the blue light emitting chip.

A material of the external bracket and the insulation bracket is an epoxy molding compound or a ceramic.

The blue light emitting chip is a flip chip.

The present invention further provides a quantum dot LED package structure, comprising a bottom bracket, an external bracket, a quantum dot layer light emitting chip, an inorganic barrier layer and a top silica gel layer;

the quantum dot layer light emitting chip being provided on the bottom bracket;

the external bracket being provided on the bottom bracket and surrounding the quantum dot layer light emitting chip;

the inorganic barrier layer covering the external bracket and the quantum dot layer light emitting chip on the bottom bracket to package the external bracket and the quantum dot layer light emitting chip;

the top silica gel layer being provided on the inorganic barrier layer;

wherein the inorganic barrier layer is formed by a low temperature sputtering method, a plasma enhanced chemical vapor deposition method or a thermal evaporation method;

wherein the quantum dot layer light emitting chip comprises a blue light emitting chip, a first insulation layer, a quantum dot layer, and a second insulation layer, which are provided on the bottom bracket from bottom to top in order.

The benefits of the present invention are: the present invention provides a quantum dot LED package structure comprising a bottom bracket, an external bracket, a quantum dot layer light emitting chip, an inorganic barrier layer and a top silica gel layer, wherein the inorganic barrier layer covering the external bracket and the quantum dot layer light emitting chip on the bottom bracket to package the external bracket and the quantum dot layer light emitting chip; the external bracket and the quantum dot layer light emitting chip are packaged by using the inorganic barrier layer, and a top silica gel layer is provided on the inorganic barrier layer, and the water and oxygen barrier condition, that the existing package structure simply using the silica gel layer cannot meet, can be satisfied and good heat dissipation can be provided for the quantum dot LED. Thus, the issues of mass production difficulty, high cost, low luminous efficiency, difficulty to achieve narrow border application of the current quantum dot LED can be solved.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
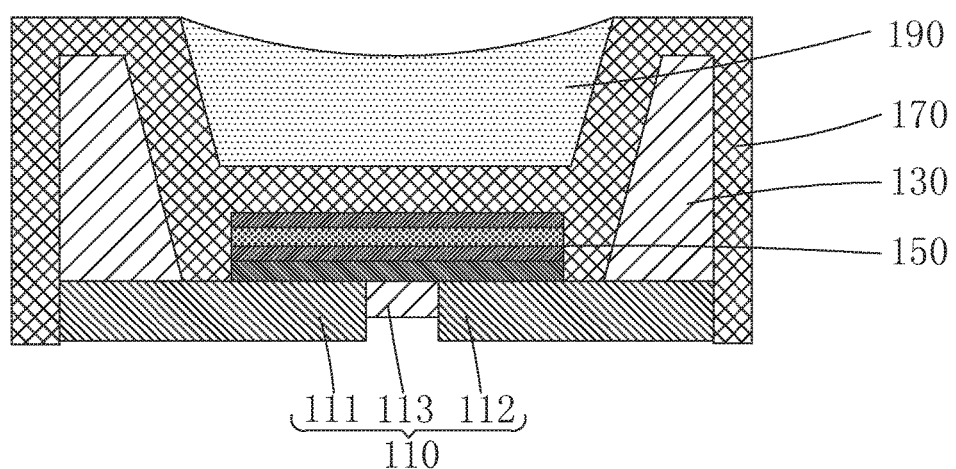
FIG. 1 is a diagram of the quantum dot LED package structure according to the present invention.

Please refer to FIG. 1. The present invention provides a quantum dot LED package structure, comprising a bottom bracket 110, an external bracket 130, a quantum dot layer light emitting chip 150, an inorganic barrier layer 170 and a top silica gel layer 190;

the quantum dot layer light emitting chip 150 being provided on the bottom bracket 110;

the external bracket 130 being provided on the bottom bracket 110 and surrounding the quantum dot layer light emitting chip 150;

the inorganic barrier layer 170 covering the external bracket 130 and the quantum dot layer light emitting chip 150 on the bottom bracket 110 to package the external bracket 130 and the quantum dot layer light emitting chip 150;

The top silica gel layer 190 is provided on the inorganic barrier layer 170. Thus, the silica gel in the top silica gel layer 190 may fill a portion of the defects of the inorganic barrier layer 170, which are formed on the surface in the deposition process to avoid the film cracking of the quantum dot LED package structure due to the rapid changes of the environmental temperature and the humidity in the usage.

The quantum dot LED package structure of the present invention packages the external bracket 130 and the quantum dot layer light emitting chip 150 by using the inorganic barrier layer 170 and provides a top silica gel layer 190 on the inorganic barrier layer 170, and the water and oxygen barrier condition, that the existing package structure simply using the silica gel layer cannot meet, can be satisfied (generally, an oxygen permeability rate of the silica gel having a low water permeability and a low oxygen permeability is 120-350 cc/m$^2$·day, and the water and oxygen barrier condition that the quantum dot LED actually requires is oxygen permeability<$10^{-1}$ cc/m$^2$·day) and good heat dissipation can be provided for the quantum dot LED. Thus, the issues of mass production difficulty, high cost, low luminous efficiency, difficulty to achieve narrow border application of the current quantum dot LED can be solved.

In particular, the inorganic barrier layer 170 is an inorganic barrier material having a low water permeability and a low oxygen permeability. It cannot only improve the good heat dissipation of the quantum dot LED package structure but also can greatly improve the water oxygen barrier effect of the quantum dot LED package structure. Furthermore, a material of the inorganic barrier layer 170 can be silicon oxide ($SiO_2$), aluminum nitride (AlN), silicon aluminum nitride (SiAlN), or aluminum oxide ($Al_2O_3$).

Specifically, the inorganic barrier layer 170 is formed by a low temperature sputtering method, a plasma enhanced chemical vapor deposition method or a thermal evaporation method.

Figure 2:
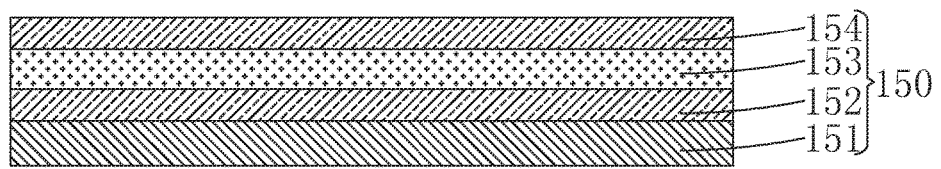
FIG. 2 is a structure diagram of the quantum dot LED package structure comprising a quantum dot layer light emitting chip according to the present invention.

Specifically, as shown in FIG. 2, the quantum dot layer light emitting chip 150 comprises a blue light emitting chip 151, a first insulation layer 152, a quantum dot layer 153, and a second insulation layer 154, which are provided on the bottom bracket 110 from bottom to top in order.

Selectably, the quantum dot layer 153 comprises two quantum dot materials, which respectively are a red quantum dot material and a green quantum dot material; the top silica gel layer 190 is a transparent silica gel material.

Or, the quantum dot layer 153 comprises only a green quantum dot material; and the top silica gel layer 190 is a silica gel layer comprising a KSF phosphorescent material, and such kind of quantum dot LED package structure has higher luminous efficiency because the KSF phosphorescent material does not absorb the green light wave band.

Specifically, a material of the first insulation layer 152 and the second insulation layer 154 is silica gel or glass.

Specifically, the bottom bracket 110 comprises a first metal bracket 111 and a second metal bracket 112 spaced apart from each other, and an insulation bracket 113 positioned between the first metal bracket 111 and the second metal bracket 112; the first metal bracket 111 and the second metal bracket 112 are respectively connected with an electrode positive and a negative electrode of the blue light emitting chip 151.

Specifically, a material of the external bracket 130 and the insulation bracket 113 is an epoxy molding compound (EMC) or a ceramic.

Specifically, the blue light emitting chip 151 is a flip chip.

Specifically, the inorganic barrier layer 170 forms a recess above the quantum dot layer light emitting chip 150, and the top silica gel layer 190 is formed in the recess and is correspondingly above the quantum dot layer light emitting chip 150.

In conclusion, the quantum dot LED package structure provided by the present invention comprises a bottom bracket, an external bracket, a quantum dot layer light emitting chip, an inorganic barrier layer and a top silica gel layer, wherein the inorganic barrier layer covering the external bracket and the quantum dot layer light emitting chip on the bottom bracket to package the external bracket and the quantum dot layer light emitting chip; the external bracket and the quantum dot layer light emitting chip are packaged by using the inorganic barrier layer, and a top silica gel layer is provided on the inorganic barrier layer, and the water and oxygen barrier condition, that the existing package structure simply using the silica gel layer cannot meet, can be satisfied and good heat dissipation can be provided for the quantum dot LED. Thus, the issues of mass production difficulty, high cost, low luminous efficiency, difficulty to achieve narrow border application of the current quantum dot LED can be solved.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A quantum dot LED package structure, comprising a bottom bracket, an external bracket, a quantum dot layer light emitting chip, an inorganic barrier layer and a top silica gel layer;
   the quantum dot layer light emitting chip being provided on the bottom bracket;
   the external bracket being provided on the bottom bracket and surrounding the quantum dot layer light emitting chip;
   the inorganic barrier layer covering the external bracket and the quantum dot layer light emitting chip on the bottom bracket to package the external bracket and the quantum dot layer light emitting chip;
   the top silica gel layer being provided on the inorganic barrier layer.

2. The quantum dot LED package structure according to claim 1, wherein a material of the inorganic barrier layer is $SiO_2$, AlN, SiAlN or $Al_2O_3$.

3. The quantum dot LED package structure according to claim 1, wherein the inorganic barrier layer is formed by a low temperature sputtering method, a plasma enhanced chemical vapor deposition method or a thermal evaporation method.

4. The quantum dot LED package structure according to claim 1, wherein the quantum dot layer light emitting chip comprises a blue light emitting chip, a first insulation layer, a quantum dot layer, and a second insulation layer, which are provided on the bottom bracket from bottom to top in order.

5. The quantum dot LED package structure according to claim 4, wherein the quantum dot layer comprises two quantum dot materials, which respectively are a red quantum dot material and a green quantum dot material.

6. The quantum dot LED package structure according to claim 4, wherein the quantum dot layer comprises a quantum dot material, which is a green quantum dot material;
   the top silica gel layer is a silica gel layer comprising a KSF phosphorescent material.

7. The quantum dot LED package structure according to claim 4, wherein a material of the first insulation layer and the second insulation layer is silica gel or glass.

8. The quantum dot LED package structure according to claim 4, wherein the bottom bracket comprises a first metal bracket and a second metal bracket spaced apart from each other, and an insulation bracket positioned between the first metal bracket and the second metal bracket;
   the first metal bracket and the second metal bracket are respectively connected with an electrode positive and a negative electrode of the blue light emitting chip.

9. The quantum dot LED package structure according to claim 8, wherein a material of the external bracket and the insulation bracket is an epoxy molding compound or a ceramic.

10. The quantum dot LED package structure according to claim 4, wherein the blue light emitting chip is a flip chip.

11. A quantum dot LED package structure, comprising a bottom bracket, an external bracket, a quantum dot layer light emitting chip, an inorganic barrier layer and a top silica gel layer;
    the quantum dot layer light emitting chip being provided on the bottom bracket;
    the external bracket being provided on the bottom bracket and surrounding the quantum dot layer light emitting chip;
    the inorganic barrier layer covering the external bracket and the quantum dot layer light emitting chip on the bottom bracket to package the external bracket and the quantum dot layer light emitting chip;
    the top silica gel layer being provided on the inorganic barrier layer;
    wherein the inorganic barrier layer is formed by a low temperature sputtering method, a plasma enhanced chemical vapor deposition method or a thermal evaporation method;
    wherein the quantum dot layer light emitting chip comprises a blue light emitting chip, a first insulation layer, a quantum dot layer, and a second insulation layer, which are provided on the bottom bracket from bottom to top in order.

12. The quantum dot LED package structure according to claim 11, wherein a material of the inorganic barrier layer is $SiO_2$, AlN, SiAlN or $Al_2O_3$.

13. The quantum dot LED package structure according to claim 11, wherein the quantum dot layer comprises two quantum dot materials, which respectively are a red quantum dot material and a green quantum dot material.

14. The quantum dot LED package structure according to claim 11, wherein the quantum dot layer comprises a quantum dot material, which is a green quantum dot material;
    the top silica gel layer is a silica gel layer comprising a KSF phosphorescent material.

15. The quantum dot LED package structure according to claim 11, wherein a material of the first insulation layer and the second insulation layer is silica gel or glass.

16. The quantum dot LED package structure according to claim 11, wherein the bottom bracket comprises a first metal bracket and a second metal bracket spaced apart from each other, and an insulation bracket positioned between the first metal bracket and the second metal bracket;

the first metal bracket and the second metal bracket are respectively connected with an electrode positive and a negative electrode of the blue light emitting chip.

17. The quantum dot LED package structure according to claim 16, wherein a material of the external bracket and the insulation bracket is an epoxy molding compound or a ceramic.

18. The quantum dot LED package structure according to claim 11, wherein the blue light emitting chip is a flip chip.

\* \* \* \* \*